United States Patent [19]

Harada et al.

[11] Patent Number: 5,160,806
[45] Date of Patent: Nov. 3, 1992

[54] ELECTROMAGNETIC SHIELDING MEMBER AND ELECTROMAGNETIC SHIELDING CASE

[75] Inventors: Takashi Harada; Ken-ichi Hatakeyama; Norio Masuda; Noboru Fujihara, all of Tokyo; Masayuki Inomata, Miyagi, all of Japan

[73] Assignee: NEC Corporation, Tokyo, Japan

[21] Appl. No.: 619,065

[22] Filed: Nov. 28, 1990

[30] Foreign Application Priority Data

| Nov. 29, 1989 | [JP] | Japan | 1-309699 |
| Apr. 25, 1990 | [JP] | Japan | 2-109757 |
| Sep. 7, 1990 | [JP] | Japan | 2-237440 |

[51] Int. Cl.$^5$ ............................................. H05K 9/00
[52] U.S. Cl. ................................. 174/35 GC; 361/424; 174/35 R
[58] Field of Search .......... 174/35 GC, 35 MS, 35 R; 219/10.55 D, 10.55 R; 361/424; 277/229, 233, 234, 235 R, 901

[56] References Cited

U.S. PATENT DOCUMENTS

| 3,889,043 | 6/1975 | Ducros | 174/35 GC |
| 3,969,572 | 7/1976 | Rostek | 174/35 MS |
| 4,110,552 | 8/1978 | Lombardi | 174/35 MS |
| 4,631,641 | 12/1986 | Brombal et al. | |
| 4,820,885 | 4/1989 | Lindsay | 174/35 GC |
| 4,857,668 | 8/1989 | Buonanno | 174/35 GC |
| 4,999,459 | 3/1991 | Smith et al. | 174/35 GC |

OTHER PUBLICATIONS

"Suppressing Magnetic Field Radiation Through Apertures in Metal Cabinet", by Ken-ichi Hatakeyama et al., 1989 International Symposium on Electromagnetic Compatibility, EiC, pp. 846-850.
"The Shielding Effect of Wave Absorber on Leakage Tyhrough the Gap of Microwave Oven" by Yasutaka Shimizu, 1984 International Symposium on Electromagnetic Compatibility, IECE, pp. 540-544.
"19-In. Cabinets Sport Shielding for FCC Compliance", EDN, 1984, pp. 156-164.

*Primary Examiner*—Leo P. Picard
*Assistant Examiner*—Bot L. Ledynh
*Attorney, Agent, or Firm*—Laff, Whitesel, Conte & Saret

[57] ABSTRACT

A shielding member includes magnetic and conductive members. The magnetic and conductive members are alternately arranged. At least one of the conductive members may be replaced with an elastic conductive electromagnetic shielding member.

13 Claims, 9 Drawing Sheets

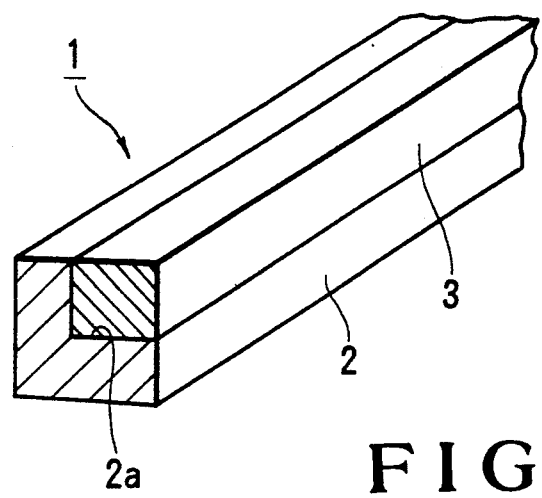
F I G.1
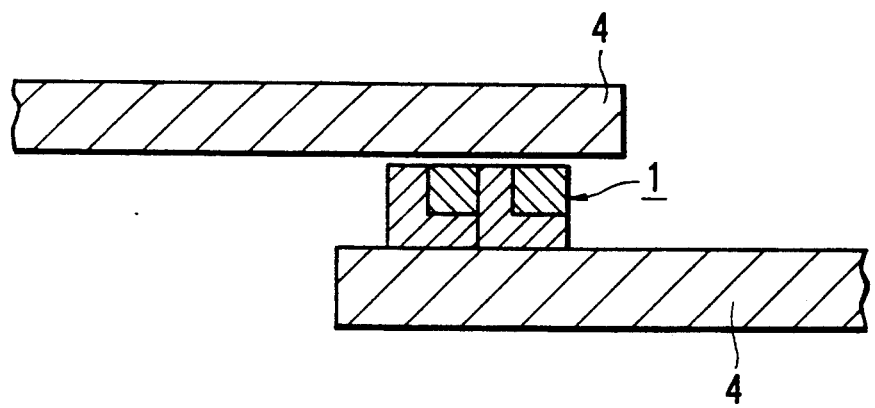
F I G.2
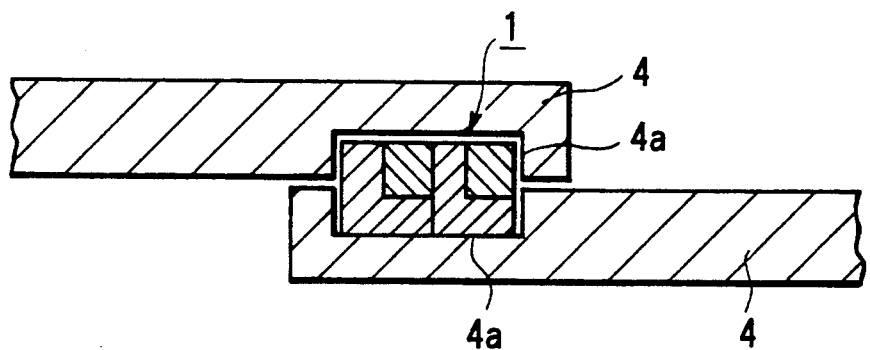
F I G.3

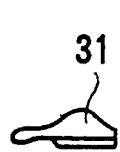
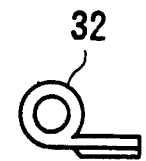
FIG.20A
PRIOR ART
FIG.21A
PRIOR ART
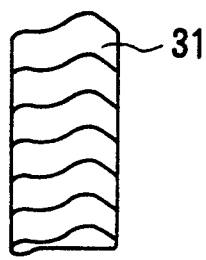
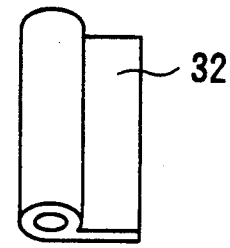
FIG.20B
PRIOR ART
FIG.21B
PRIOR ART
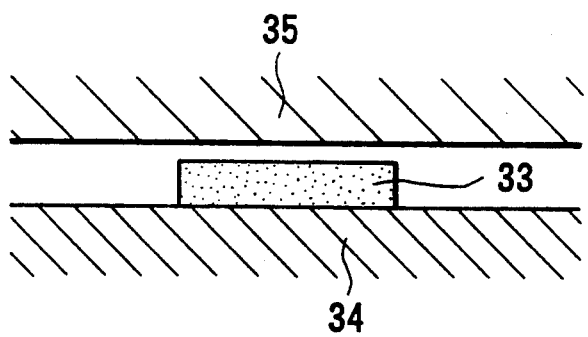
FIG.22
PRIOR ART

ELECTROMAGNETIC SHIELDING MEMBER AND ELECTROMAGNETIC SHIELDING CASE

BACKGROUND OF THE INVENTION

The present invention relates to an electromagnetic shielding member for preventing electromagnetic wave leakage and entrance and, more particularly, to an electromagnetic shielding member which is used for a seam portion of a metal case or a door portion of an electromagnetic shielding chamber so as to suppress electromagnetic waves leaking from a contact portion.

When electromagnetic shielding is to be performed, since, in general, the conductivity of a portion at which conductive members such as metal members are in contact with each other is partially decreased, an electromagnetic shielding member must be arranged at the contact portion between the conductive members in order to suppress leaking electromagnetic waves.

As conventional electromagnetic shielding members of this type, for example, the following members have been used: a spring finger gasket 31 constituted by a comb-like metal piece shown in a cross-sectional view of FIG. 20A and in a perspective view of FIG. 20B; and an EMI gasket 32 constituted by a conductive rubber tube shown in a cross-sectional view of FIG. 21A and in a perspective view of FIG. 21B ("Summary of Electromagnetic Shield and Earth System", Nihon Kogyo Gijutsu Center). The electromagnetic shielding member shown in FIGS. 20A and 20B is inserted between contact portions of conductive members by using the biasing force of the metal piece, whereas the electromagnetic shielding member shown in FIGS. 21A and 21B is inserted between the conductive portions by using the elasticity of the conductive rubber, thus increasing conductivity.

In a microwave oven, a ferrite member 33 is arranged in a gap between a main body 34 and a door 35 as shown in FIG. 22, in order to absorb leaking electromagnetic waves ("THE SHIELDING EFFECT OF WAVE ABSORBER ON LEAKAGE THROUGH THE GAP OF MICROWAVE OVEN" by Yasutaka Shimizu, 1984 INTERNATIONAL SYMPOSIUM ON ELECTROMAGNETIC COMPATIBILITY, IECE, pps. 540–544).

The conductive electromagnetic shielding member shown in FIGS. 20A and 20B or FIGS. 21a and 21B is designed such that the spring finger gasket 31 or the gasket 32 must be brought into direct contact with surfaces of conductive members. Therefore, if coatings are to be applied to the conductive members, non-coated portions are required on the surfaces of the conductive members because the coatings may serve as insulating members. If the spring finger gasket 31 and the gasket 32 are not used, since a contact state between a case and a mounting portion of an electromagnetic shielding chamber influences electromagnetic wave leakage, a mechanism for reinforcing the contact state is required. In addition, if the spring finger gasket 31 and gasket 32 are used, degradation in shielding effectiveness is caused by changes in biasing force and elasticity with a lapse of time. Furthermore, as indicated by a curve a in FIG. 14, a shielding effectiveness is reduced in a low-frequency band in which electromagnetic wave source has a relatively low impedance.

In the method of inserting the electromagnetic wave absorbing member, as FIG. 9A shows its structure and a curve a in FIG. 8 indicates a frequency characteristic of a shielding effectiveness corresponding to the structure, only a small amount of electromagnetic waves is absorbed and hence a satisfactory leakage suppressing effect cannot be obtained in a low-frequency band in which the length of a gap in the popagation direction becomes very small in comparison with a wavelength.

SUMMARY OF THE INVENTION

It is an object of the present invention to provide an electromagnetic shielding member which is arranged at a contact portion of a metal case or around a door portion so as to suppress electromagnetic wave leakage, and which can be used at a coated surface and require no special mechanism for reinforcing a contact state.

It is another object of the present invention to provide an electromagnetic shielding case.

In order to achieve the above objects, according to the present invention, there is provided a shielding member comprising alternately arranged magnetic and conductive members.

According to the present invention, at least one of the conductive members is replaced with an elastic conductive electromagnetic shielding member.

According to the present invention, an electromagnetic shielding member comprises a conductive rod having an L-shaped cross-section and a magnetic rod having a rectangular cross-section matching an L-shaped recess of the conductive rod. The rectangular magnetic rod is integrally fitted in the L-shaped recess of the conductive rod so as to constitute a structure having a rectangular cross-section.

According to the present invention, an electromagnetic shielding member comprises a conductive rod having an L-shaped cross-section and a magnetic rod having a rectangular cross-section matching an L-shaped recess of the conductive rod. The rectangular magnetic rod is integrally fitted in the L-shaped recess of the conductive rod so as to constitute a structure having a cross-section in which a portion of the magnetic member protrudes or is recessed.

According to the present invention, an electromagnetic shielding member comprises a conductive rod having a U-shaped cross-section, and a magnetic rod having a rectangular cross-section matching a U-shaped recess of the conductive rod. The rectangular magnetic rod is integrally fitted in the U-shaped recess of the conductive rod so as to constitute a structure having a rectangular cross-section or a cross-section in which a portion of the magnetic rod protrudes or is recessed.

According to the present invention, an electromagnetic shielding member comprises magnetic strips each having a rectangular cross-section, and conductive strips each having a rectangular cross-section, the magnetic and conductive strips being alternately arranged to constitute a plate-like member. The magnetic and conductive strips are alternately exposed on a surface of the plate-like member, and the plate-like member is arranged in a gap between conductive walls, from which electromagnetic waves leak, such that surfaces of the plate-like member oppose the conductive walls.

According to the present invention, at least one of the conductive strips is constituted by a conductive electromagnetic shielding member having elasticity and protruding from a surface portion of the plate-like member, and the conductive electromagnetic shielding member having elasticity is brought into conductive contact with each of the conductive walls defining the gap.

According to the present invention, an electromagnetic shielding case comprises an electromagnetic shielding member having a structure in which one or a plurality of magnetic members and conductive members are alternately arranged, the electromagnetic shielding member being provided to either or both of the main body and a door so as to enclosure an opening of a main body.

According to the present invention, the electromagnetic shielding case comprises an electromagnetic shielding member having a structure in which at least one of the conductive members is replaced with a conductive electromagnetic shielding member having elasticity, and the main body and the door are brought into conductive contact with each other through the electromagnetic shielding member.

A low-conductivity portion or a gap which is formed when conductive members are brought into contact with each other equivalently serves as a waveguide and hence causes electromagnetic wave leakage. If a magnetic rod 3 is arranged in a direction to cross this waveguide as shown in FIG. 7, a propagation state of electromagnetic waves is changed at a boundary portion between a conductive rod 2 and the magnetic rod 3 so as to reflect the waves (see a flow 6 of electromagnetic waves in FIG. 7). With this reflection, the amount of leaking electromagnetic waves can be reduced. In order to enhance the leakage suppressing effect, the numbers of the magnetic and conductive rods 3 and 2 may be increased to increase the number of mismatching states of characteristic impedances for causing a reflection of electromagnetic waves, as indicated by structures in FIGS. 9B, 9C, and 9D and corresponding frequency characteristics of shielding effectiveness represented by curves b, c, and d in FIG. 8.

In addition, as shown in FIG. 11, when magnetic strips 12, each having a rectangular cross-section, and conductive strips 13, each having a rectangular cross-section, are alternately joined together to be integrally formed, and are arranged in the direction to cross this waveguide in such a manner that the surfaces of the strips 12 and 13 oppose both conductive walls 14a and 14b defining a gap serving as the waveguide, reflection is caused by mismatching of characteristic impedances at a boundary portion between the magnetic and conductive strips 12 and 13. With this reflection, the amount of leaking electromagnetic waves can be reduced. In order to enhance the leakage suppressing effect, the numbers of the magnetic and conductive rods 12 and 13 may be increased to increase the number of mismatching states of characteristic impedances for causing a reflection of electromagnetic waves, as indicated by structures in FIGS. 9C and 9D and corresponding frequency characteristics of shielding effectiveness represented by curves c and d in FIG. 8.

The shielding effectiveness obtained by the above-described electromagnetic shielding member is reduced in a high-frequency band, as shown in the curves b, c, and d in FIG. 8. This phenomenon is based on the fact that the permeability of ferrite is reduced at a high frequency and its magnetic effect is reduced accordingly ("Characteristic of Ferrite Loss", Paper of the Institute of Electronics and Communication Engineers of Japan, Vol. 53-C, No. 9, pp. 631–636). In contrast to this, as indicated by a curve a in FIG. 14, the shielding effectiveness of a conventional conductive shielding member is reduced in a low-frequency band in which a wave source tends to exhibit a relatively low impedance. By forming two types of shielding members as shown in FIG. 13, a wide-band shielding effectiveness as indicated by a curve b in FIG. 14 can be obtained. In this case, strong conductive contact, which is required when a single conductive shielding member is used, is not required.

BRIEF DESCRIPTION OF THE DRAWINGS

FIGS. 1, 4, 5, and 6 are perspective views showing an electromagnetic shielding member according to the first embodiment of the present invention;

FIGS. 2 and 3 are cross-sectional views each showing a state wherein the electromagnetic shielding member of the first embodiment of the present invention is applied to a seam portion of a metal case;

FIGS. 20A and 20B and FIGS. 21A and 21B are views showing conventional electromagnetic shielding members; and FIG. 22 is a cross-sectional view showing a case wherein a conventional electromagnetic wave absorbing member is arranged, as an electromagnetic shielding member, in a gap of a metal case.

DESCRIPTION OF THE PREFERRED EMBODIMENTS

Figure 4:
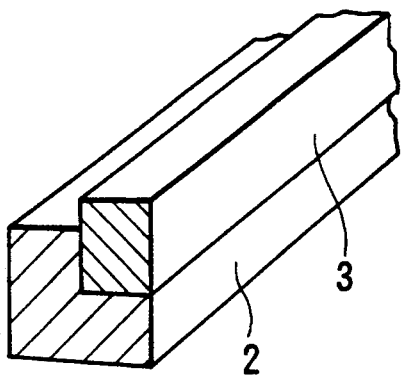

The present invention will be described below with reference to the accompanying drawings.

FIG. 1 shows the first embodiment of the present invention. Referring to FIG. 1, the present invention comprises a conductive rod 2 having an L-shaped cross-section perpendicular to the longitudinal direction, and a magnetic rod 3 having a rectangular cross-section matching an L-shaped recess 2a of the conductive rod 2. An electromagnetic shielding member 1 as a structure having a rectangular cross-section is formed by integrally fitting the magnetic rod 3 in the L-shaped recess 2a of the conductive rod 2.

The conductive rod 2 is made of a metal such as aluminum, a conductive polymeric resin, or a polymeric resin having a conductive coating or a conductive film formed thereon. The magnetic rod 3 is made of a sintered ferrite material, a polymeric material containing a ferrite powder, or a magnetic alloy such as a magnetic amorphous alloy or a permalloy. In order to obtain a sufficient attenuation in a frequency band higher than several 10 MHz, the magnetic rod 3 is preferably made of a sintered ferrite material exhibiting a small decrease in permeability in a high-frequency band.

FIG. 2 shows a case wherein the electromagnetic shielding member of the present invention is applied to a seam portion of a metal case. A space is formed between two conductive members 4 constituting a metal case, and the electromagnetic shielding member 1 of the present invention is arranged in the space. The number of electromagnetic shielding members 1 may be adjusted in accordance with a required leakage suppression effect. Assume that Ni-Zn sintered ferrite with a cross-section having a width of 5 mm and a thickness of 3 mm is used for the magnetic rod 3. In this case, if one electromagnetic shielding member 1 with a cross-section having a width of 10 mm and a thickness of 5 mm is used, a leakage suppressing effect corresponds to 25 dB. If two electromagnetic shielding members 1 are used, a leakage suppressing effect corresponds to 35 dB.

In addition, as shown in FIG. 3, if a recess or recesses 4a are formed in one or both of the conductive members 4, and the electromagnetic shielding member 1 or members 2 are formed therein, a more stable seam state can be obtained.

Note that the electromagnetic shielding member 1 must be fixed to the conductive member 4 with screws or a conductive adhesive agent to ensure satisfactory conductivity.

As described above, according to the principle of shielding of the electromagnetic shielding member of the present invention, electromagnetic waves leaking from a portion having a low conductivity or from a gap are reflected by means of mismatching of characteristic impedances to reduce a leakage amount. Therefore, conductive members need not substantially be in contact with each other, and the present invention can be applied to coated surfaces. In addition, the present invention requires no mechanism for reinforcing conductive contact.

As described above, the present invention can be applied to a contact portion between conductive members to suppress leaking electromagnetic waves without requiring conductive contact. Therefore, the present invention can be applied to coated surfaces and the like and requires no mechanism for reinforcing contact. In addition, by properly selecting the number of shielding members, desired electromagnetic shielding characteristics can be obtained, thereby realizing an effective shielding countermeasure.

Figure 5:
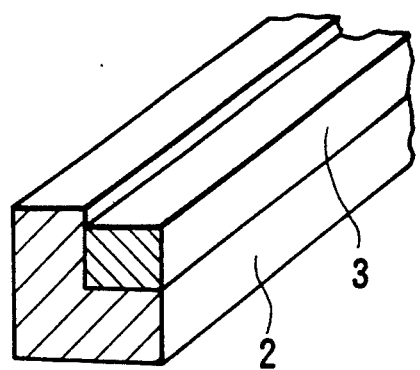

Note that a cross-section of a combination of the magnetic rod 3 and the conductive rod 2 need not be rectangular. The magnetic rod 3 may protrude as shown in FIG. 4 or may be recessed as shown in FIG. 5.

Figure 6:
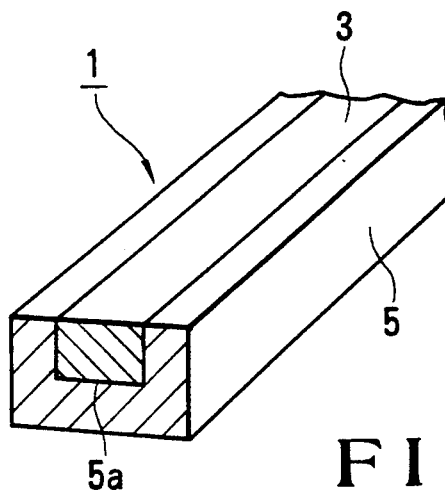
Figure 7:
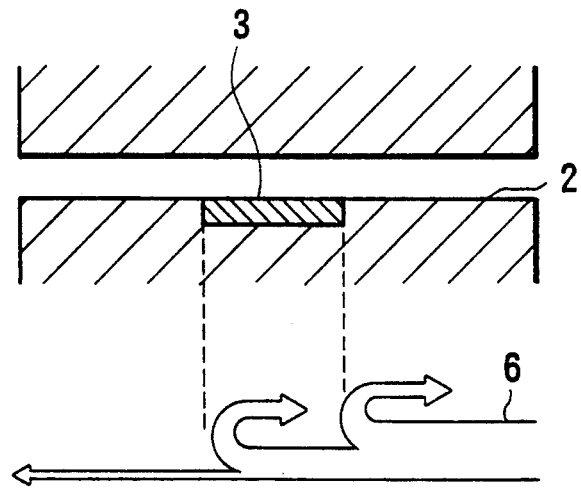
FIG. 7 is a view showing a principle of an electromagnetic wave leakage suppressing effect.

In addition, as shown in FIG. 6, the electromagnetic shielding member 1 may comprise a conductive rod 5 having a U-shaped cross-section, and a magnetic rod 3 having a rectangular cross-section matching a recess 5a of the conductive rod 5, and the magnetic rod 3 is integrally fitted in the recess 5a of the conductive rod 5 to constitute a structure having a rectangular cross-section or having the protruding or recessed magnetic rod. If this electromagnetic shielding member 1 is arranged in a space of a metal case, a structure equivalent to that shown in FIG. 7 is constituted, and a good shielding effectiveness can be obtained.

The magnetic bar 3 used for the electromagnetic shielding member of the present invention is designed to have a cross-section having a thickness of 3 mm or more and a width of 1 mm or more, provided that it is rectangular. In addition, the magnetic bar 3 may have a rectangular shape other than the one described above In this case, the cross-section may have a similar size.

Figure 10:
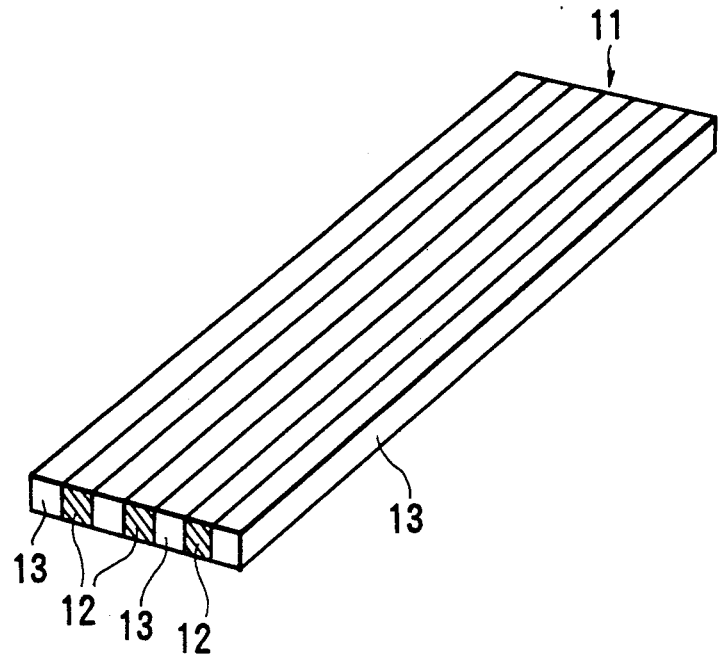
FIG. 10 is a perspective view showing an electromagnetic shielding member according to the second embodiment of the present invention.

FIG. 10 shows the second embodiment of the present invention.

Referring to FIG. 10, an electromagnetic shielding member 11 of the present invention has a plate-like shape which is formed by alternately joining magnetic strips 12, each having a rectangular cross-section, and conductive strips 13, each having a rectangular cross-section. In this structure, end faces of the magnetic and conductive strips 12 and 13 alternately appear on a surface of the plate-like member 11.

Each magnetic strip 12 may consist of a sintered ferrite material, a polymeric material containing a ferrite powder, or a magnetic alloy such as a magnetic amorphous alloy or a permalloy. In order to obtain a satisfactory shielding effectiveness in a frequency band higher than several 10 MHz, each magnetic strip 12 is preferably made of sintered ferrite having a low permeability in a high-frequency band. Each conductive strip 13 consists of, e.g., a metal such as iron or aluminum, a conductive polymeric resin, or a polymeric resin having a conductive coating or a conductive film formed thereon.

Figure 11:
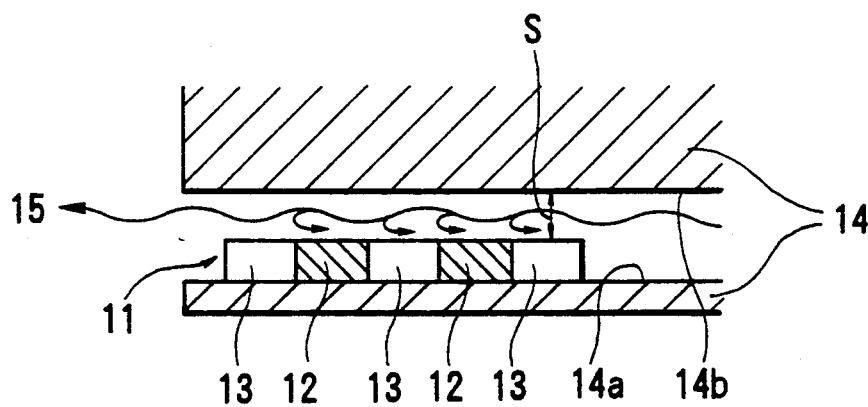
FIG. 11 is a cross-sectional view showing a state wherein the electromagnetic shielding member of the second embodiment of the present invention is applied to a metal seam portion.

FIG. 11 shows a case wherein the electromagnetic shielding member 11 of the present invention is applied to a seam portion of a metal case 14. The electromagnetic shielding member 11 is obtained by integrally joining three conductive strips 13 consisting of metal ross and two magnetic strips 12 consisting of NiZn sintered ferrite rods having identical cross-sections in such a manner that the conductive strips 13 and the magnetic strips 12 are alternately arranged to cause their end faces to oppose conductive walls 14a and 14b. In this case, the electromagnetic shielding member 11 is set at the seam portion while it is in conductive contact with one of the walls defining a gap, i.e., the conductive wall 14a, without being in contact with the other conductive wall 14b. When the electromagnetic shielding member 11 comprising the magnetic and conductive strips 12 and 13 whose cross-sections having the same size of 3 mm×5 mm is used, and a gap S of 1 mm is present, a suppressing effect with respect to a leaking electromagnetic wave 15 corresponds to the curve b, i.e., 20 dB or more in a frequency band of 20 MHz or less.

Since the magnetic strips 12 are used, the electromagnetic shielding member 11 is brought into conductive contact with the conductive wall constituting the gap.

For this reason, the electromagnetic shielding member 11 is free from the influences of a coating on the conductive wall and hence can be directly applied to a coated conductive wall.

In this embodiment, each of the magnetic and conductive strips 12 and 13 has a rectangular cross-section having a size of 3 mm×5 mm. Each of the strips 12 and 13 may have a thickness of 3 mm or more and a width of 2.5 mm or more and may have a shape other than a rectangular shape. In this case, each strip may have a similar size. The surfaces of the magnetic and conductive strips 12 and 13, of the electromagnetic shielding member 11, which constitute the surface opposite to the conductive wall 14b need not be located on the same plane, and the surfaces of the strips 12 or the strips 13 may protrude.

Figure 12:
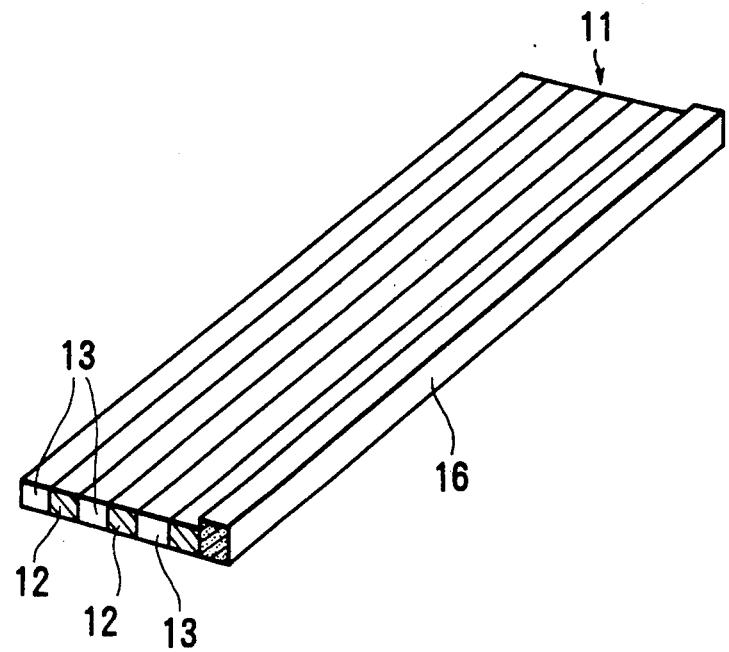
FIG. 12 is a perspective view showing an electromagnetic shielding member according to the third embodiment of the present invention.

FIG. 12 shows the third embodiment of the present invention.

Figure 13:
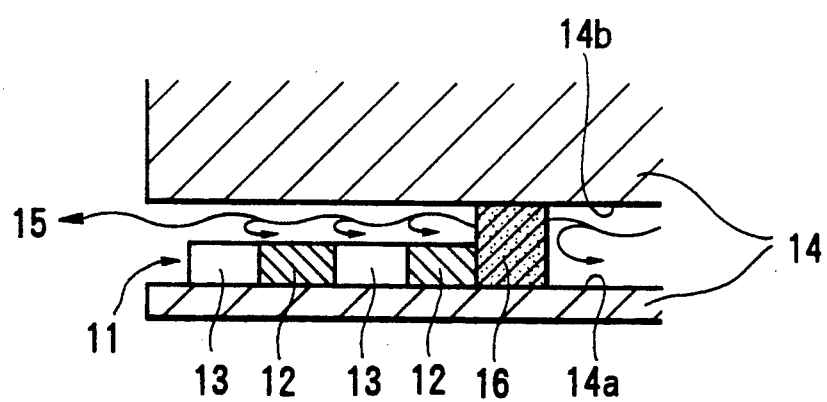
FIG. 13 is a cross-sectional view showing a state wherein the electromagnetic shielding member of the third embodiment of the present invention is applied to a seam portion of a metal case.

In the embodiment shown in FIG. 12, one of the conductive strips of the electromagnetic shielding member 11 shown in FIG. 10 is replaced with an elastic conductive shielding member 16 obtained by coating a polyurethane foam member with a silver-coated conductive cloth. The conductive shielding member 16 having conductivity protrudes upward from a surface of the plate-like member. FIG. 13 shows a case wherein this electromagnetic shielding member 11 is applied to a seam portion of a metal case 14. In this case, the electromagnetic shielding member 16 is in slight, conductive contact with one conductive wall 14b defining a gap together with the other wall, i.e., a conductive wall 14a, and the gap formed between the two walls 14a and 14b is closed by the conductive shielding member 16.

Figure 14:
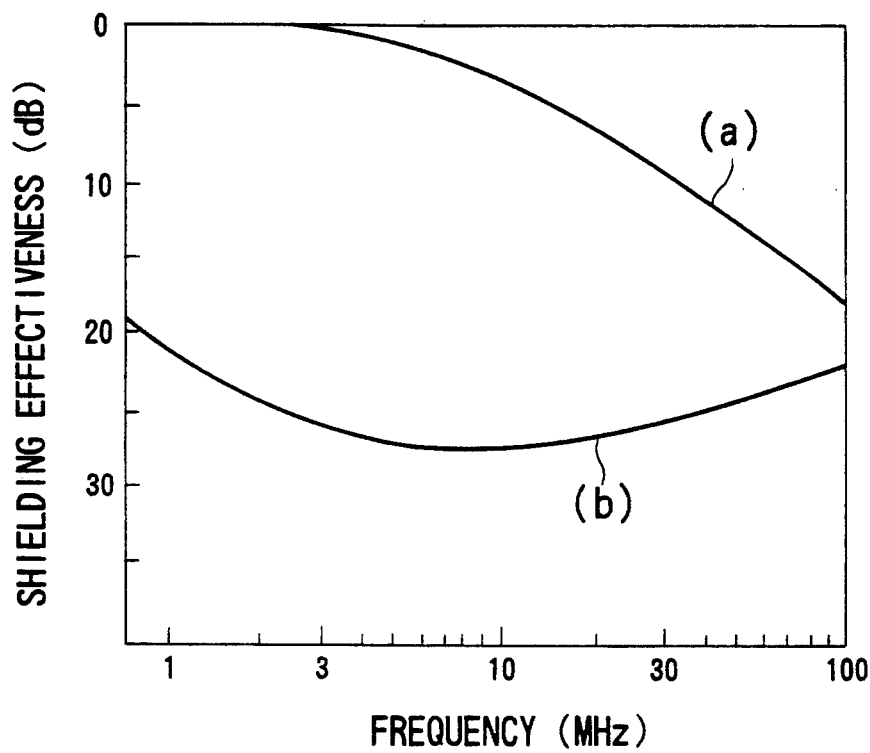
FIG. 14 is a graph showing frequency characteristics of an electromagnetic wave leakage suppressing effect according to the third embodiment of the present invention.

In this embodiment, a shielding characteristic indicated by a curve b in FIG. 14, which exhibits a wide-band shielding effectiveness, is obtained by a combination of the effect obtained by the electromagnetic shielding member 11 of the second embodiment and the effect obtained by the conductive shielding member 16.

In this embodiment, although each of the magnetic and conductive strips has a rectangular cross-section, it may have a circular, elliptic, or polygonal cross-section. In addition, each strip need not have a rod-like shape having a uniform cross-section and may have an optimal shape in accordance with a case to which it is applied. However, each strip preferably has a rod-like shape having a uniform cross-section in consideration of a shielding effectiveness. In addition, as the conductive shielding member 16, an elastic conductive shielding member such as the spring finger gasket in FIGS. 20A and 20B or the EMI gasket shown in FIGS. 21A and 21B may be used.

In the above-described first, second, and third embodiments, in order to obtain a satisfactory shielding effectiveness, each of the electromagnetic shielding members 1 and 11 is preferably applied to the entire gap formed in a case.

Figure 15:
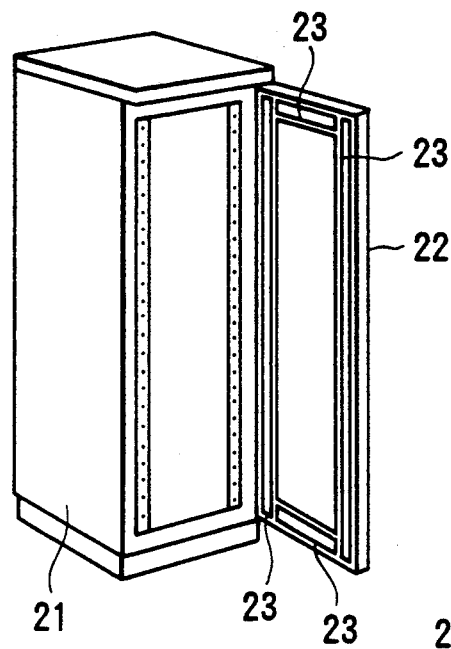
FIG. 15 is a perspective view showing a state wherein a door of an electromagnetic shielding member according to the fourth embodiment of the present invention is open.
Figure 16:
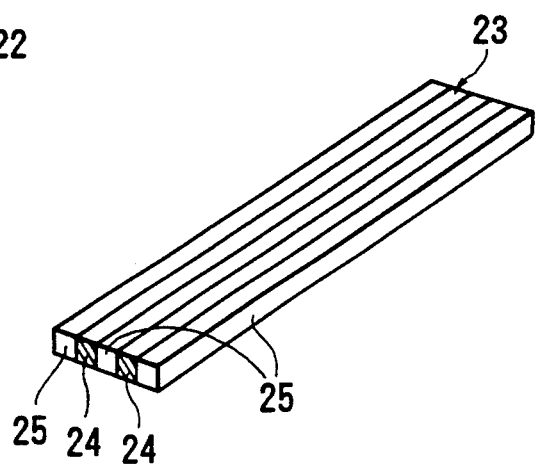
FIGS. 16 and 18 are perspective views showing electromagnetic shielding members used for the fourth embodiment of the present invention.

FIG. 15 shows a state wherein a door of an electromagnetic shielding case according to an embodiment of the present invention is open. An electromagnetic shielding member 23 is attached to a door 22 so as to enclose an opening of a main body 21 upon closing of the door 22 of the main body 21. FIG. 16 shows an electromagnetic shielding member according to an embodiment of the present invention. This member is formed by integrally combining magnetic and conductive rods 24 and 25. Each magnetic rod 24 may be made of a sintered ferrite material, a polymeric material containing a ferrite powder, or a magnetic alloy such as a magnetic amorphous alloy or a permalloy. However, in order to obtain a sufficient attenuation effect in a frequency band of several 10 MHz or more, each magnetic rod 24 is preferably made of sintered ferrite material exhibiting a small decrease in permeability in a high-frequency band. Each conductive rod 25 is made of a metal such as aluminum, a conductive polymeric resin, or a polymeric resin having a conductive coating or a conductive film formed thereon.

Figure 8:
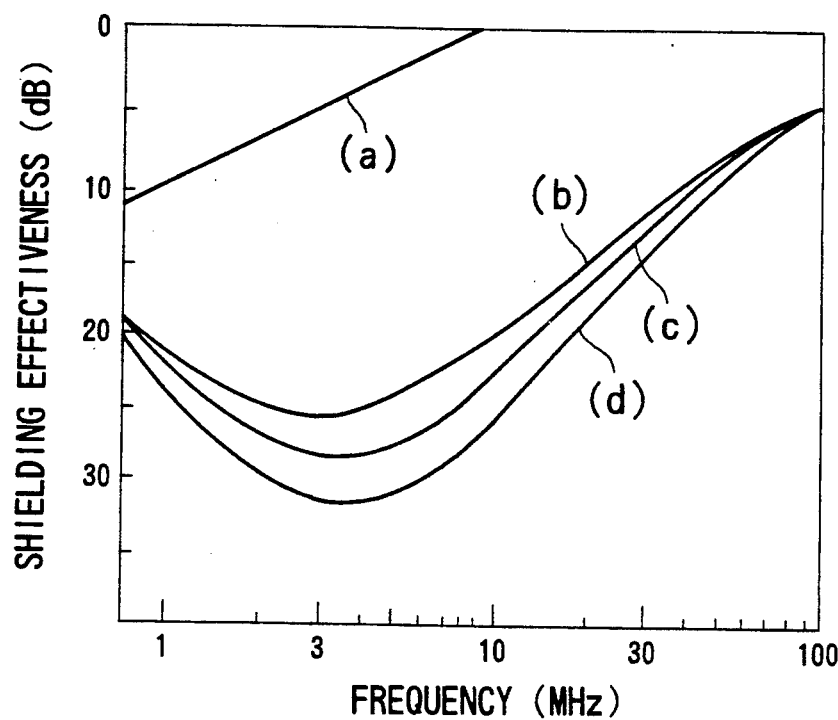
FIG. 8 is a graph showing frequency characteristics of an electromagnetic wave leakage suppressing effect of the present invention.
Figure 9A:
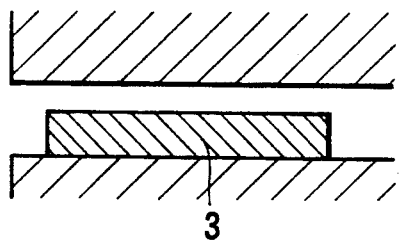
FIGS. 9A to 9D are cross-sectional views respectively showing states wherein electromagnetic shielding members associated with the frequency characteristics of the electromagnetic wave leakage suppressing effect shown in FIG. 8 are applied to metal case seam portions.
Figure 9C:
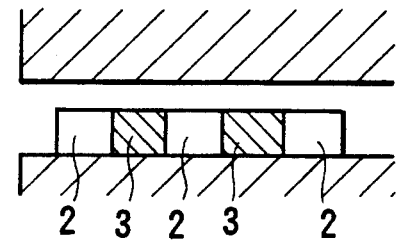
Figure 9B:
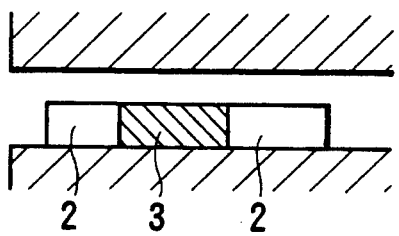
Figure 9D:
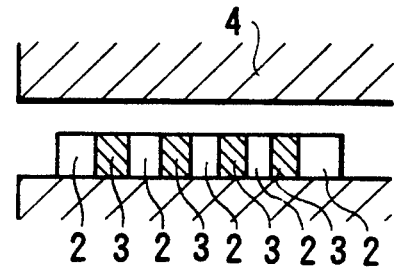
Figure 17:
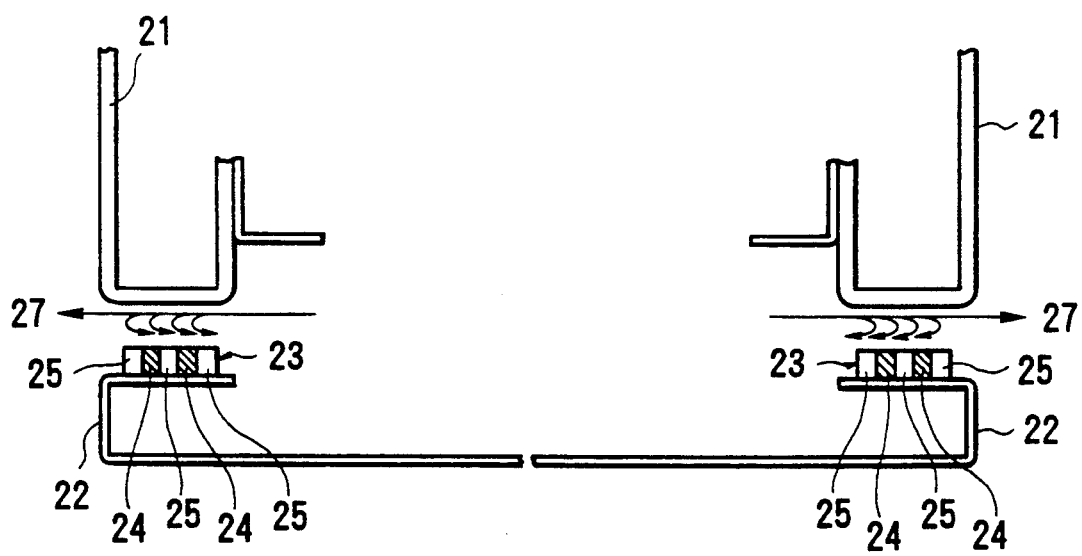
FIGS. 17 and 19 are cross-sectional views each showing a state wherein a door is mounted on a main body in FIG. 15.

FIG. 17 shows a case wherein the open state of the door 22 of the main body 21 shown in FIG. 15 is changed to a closed state. An electromagnetic shielding member 23 mounted on the door 22 is obtained by integrally joining three conductive rods 25 each consisting of a metal and two magnetic rods 24 each consisting of Ni-Zn sintered ferrite in such a manner that the rods 25 and 24 are alternately arranged. When an electromagnetic shielding member constituted by magnetic and conductive rods 24 and 25 each having a cross-section of 3 mm×5 mm, and a gap of 1 mm is present between the main body 21 and the door 22, a leaking electromagnetic wave suppressing effect corresponds to the curve c in FIG. 8. That is, a leakage suppressing effect corresponding to 20 dB or more can be obtained in a frequency band of 20 MHz or less.

Figure 18:
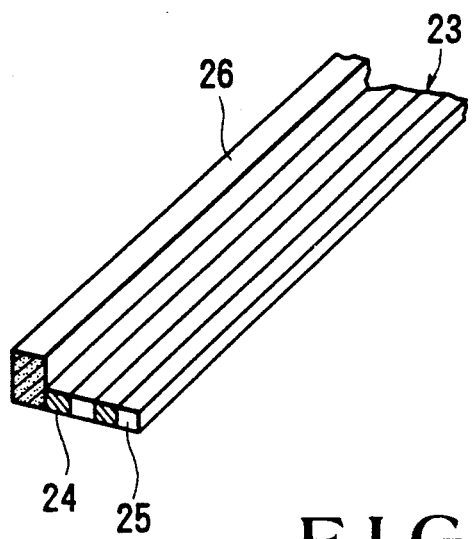
Figure 19:
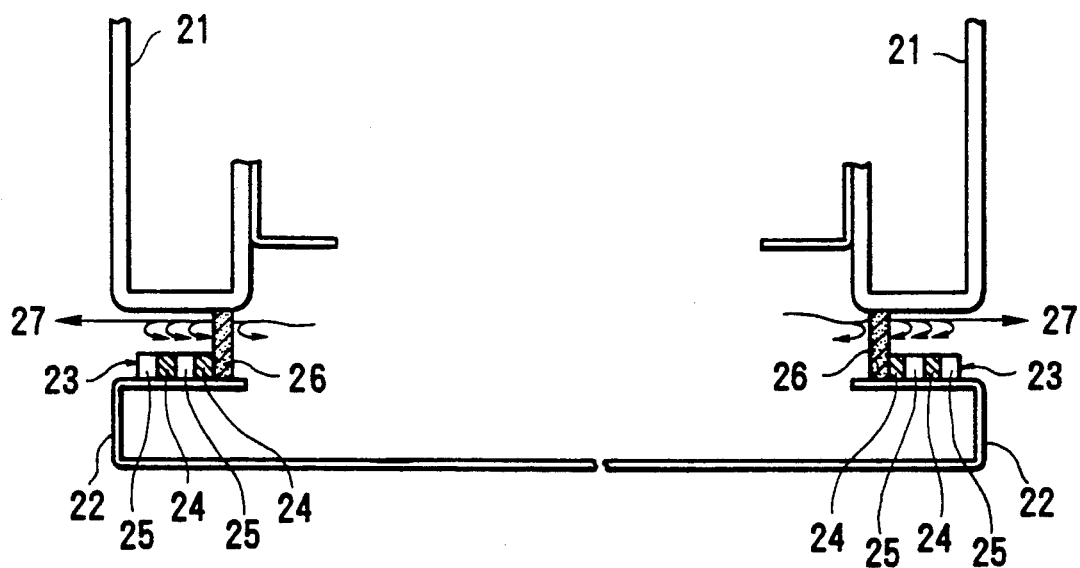

FIG. 18 shows a structure formed by replacing one of the conductive rods of the electromagnetic shielding member shown in FIG. 16 with an elastic conductive shielding member 26 obtained by coating a polyurethane member with a silver-coated conductive cloth. FIG. 19 shows a state wherein a door 22 of a main body is closed as in FIG. 17. In this case, since the conductive shielding member 26 is brought into conductive contact with the main body 21, conductive contact between the main body 21 and the door 22 is maintained. In this case, the frequency characteristics of a shielding effectiveness correspond to the curve b in FIG. 14. A wide-band leakage suppressing effect can be obtained by a combination of the effect obtained by the electromagnetic shielding member of the second embodiment and the effect of the conductive shielding member.

As has been described above, according to the present invention, the electromagnetic shielding member can be applied to a seam portion of a metal case so as to suppress leaking electromagnetic waves in a state requiring no conductive contact or in a slight contact state. Therefore, the present invention can be applied to a coated surface and requires no mechanism for reinforcing conductive contact. This enables an effective shielding countermeasure. That is, the present invention is effectively applied to suppress unwanted electromagnetic waves radiated from an electronic equipment and can be applied to an electromagnetic shielding chamber.

In addition, according to the electromagnetic shielding case of the present invention, unwanted electromagnetic waves leaking from a gap between a main body and door are suppressed by an electromagnetic shielding member which is arranged in the gap and is only slightly influenced by conductive contact. Therefore, unwanted electromagnetic waves leaking from the gap between the main body and the door can be suppressed in a state requiring no conductive contact between the main body and the door or without requiring any means for reinforcing contact.

What is claimed is:

1. An electromagnetic shielding assembly comprising strips of soft magnetic material, each of said strips having a rectangular cross-section, and conductive strips each having a rectangular cross-section, said soft magnetic strips and conductive strips being alternately arranged to constitute a plate-like member, wherein said soft magnetic strips and conductive strips are alternately exposed on a surface of said plate-like member, and said plate-like member is arranged in a gap between conductive walls which are not in conductive contact with each other, electromagnetic waves being able to leak through said gap, such that surfaces of said plate-like member oppose the conductive walls.

2. An assembly according to claim 1, wherein said conductive and soft magnetic strips are respectively constituted by an electromagnetic shielding member comprising a conductive rod having an L-shaped cross-section and a soft magnetic rod having a rectangular cross-section matching an L-shaped recess of said conductive rod, said rectangular soft magnetic rod being integrally fitted in the L-shaped recess of said conductive rod so as to constitute a structure having a rectangular cross-section.

3. An assembly according to claim 1, wherein said conductive and soft magnetic strips are respectively constituted by an electromagnetic shielding member comprising a conductive rod having an L-shaped cross-section and a soft magnetic rod having a rectangular cross-section matching an L-shaped recess of said conductive rod, said rectangular soft magnetic rod being integrally fitted in the L-shaped recess of said conductive rod so as to constitute a structure having a cross-section in which a portion of said soft magnetic rod protrudes.

4. An assembly according to claim 1, wherein said conductive and soft magnetic strips are respectively constituted by an electromagnetic shielding member comprising a conductive rod having a U-shaped cross-section and a magnetic rod having a rectangular cross-section matching a U-shaped recess of said conductive rod, said rectangular magnetic rod being integrally fitted in the U-shaped recess of said conductive rod so as to constitute a structure having a rectangular cross-section.

5. An assembly according to claim 1, wherein at least one of said conductive strips is constituted by a conductive electromagnetic shielding member having elasticity and protruding from a surface portion of said plate-like member, and said conductive electromagnetic shielding member having elasticity is brought into conductive contact with each of the conductive walls defining the gap.

6. An assembly according to claim 1, wherein said member is provided to either or both of a main body having an opening and a metal door for closing the opening, of an electromagnetic shielding case, so as to enclosure the opening of the main body.

7. An assembly according to claim 6, wherein said electromagnetic shielding case comprises an electromagnetic shielding member having a structure in which at least one of said conductive members is replaced with a conductive electromagnetic shielding member having elasticity, and the main body and the door are brought into conductive contact with each other body through said electromagnetic shielding member.

8. An assembly according to claim 1, wherein said conductive and soft magnetic strips are respectively constituted by an electromagnetic shielding member comprising a conductive rod having an L-shaped cross-section and a magnetic rod having a rectangular cross-section matching an L-shaped recess of said conductive rod, said rectangular magnetic rod being integrally fitted in the L-shaped recess of said conductive rod so as to constitute a structure having a cross-section in which a portion of said magnetic rod is recessed.

9. An assembly according to claim 1, wherein said conductive and soft magnetic strips are respectively constituted by an electromagnetic shielding member comprising a conductive rod having a U-shaped cross-section and a magnetic rod having a rectangular cross-section matching a U-shaped recess of said conductive rod, said rectangular magnetic rod being integrally fitted in the U-shaped recess of said conductive rod so as to constitute a structure having a cross-section in which a portion of said magnetic rod protrudes.

10. An assembly according to claim 1, wherein said conductive and soft magnetic strips are respectively constituted by an electromagnetic shielding member comprising a conductive rod having a U-shaped cross-section and a magnetic rod having a rectangular cross-section matching a U-shaped recess of said conductive rod, said rectangular magnetic rod being integrally fitted in the U-shaped recess of said conductive rod so as to constitute a structure having a cross-section in which a portion of said magnetic rod is recessed.

11. An electromagnetically shielded metal housing having an opening and a door, comprising:
a planar flange surrounding said opening; and
an electromagnetic member which is in a gap between said door and said flange when said door is closed,
said electromagnetic shielding member comprising soft magnetic strips and conductive strips alternately arranged to constitute a plate-like member, and
said electromagnetic shielding member being fitted on one of said flange or said door, parallel to conductive walls in said gap.

12. A housing according to claim 11, wherein at least one of said conductive strips is made of said electromagnetic shielding member having conductive and elastic characteristics, said electromagnetic shielding member being in electrical contact with metallic surfaces of said flange and said door when said door is closed.

13. The structure of any one of the claims 11 where said strips of soft magnetic material are made of a nickel-zink sintered ferrite.

* * * * *